United States Patent [19]

Kinsman

[11] Patent Number: 5,499,002
[45] Date of Patent: Mar. 12, 1996

[54] RESONATOR FILTER UTILIZING CASCADED IMPEDANCE INVERTERS

[76] Inventor: Robert G. Kinsman, 1129 N. Loomis St., Naperville, Ill. 60563

[21] Appl. No.: 234,748

[22] Filed: Apr. 28, 1994

[51] Int. Cl.$^6$ .................................................. H03H 9/00
[52] U.S. Cl. ............................ 333/187; 333/195; 333/189
[58] Field of Search ..................................... 333/186–196

[56] References Cited

U.S. PATENT DOCUMENTS

| | | | |
|---|---|---|---|
| 2,342,875 | 2/1944 | Lovell | 333/190 |
| 2,406,796 | 9/1946 | Bies | 333/190 |
| 4,295,108 | 10/1981 | Ieki | 333/193 |
| 4,297,660 | 10/1981 | Ieki et al. | 333/194 |
| 4,689,586 | 8/1987 | Yamada et al. | 333/194 |
| 4,734,664 | 3/1988 | Hikita et al. | 333/194 |
| 4,803,449 | 2/1989 | Hikita et al. | 333/196 |
| 5,093,638 | 3/1992 | Kinsman et al. | 333/195 |
| 5,294,898 | 3/1994 | Dworsky et al. | 333/187 |

OTHER PUBLICATIONS

"Resonator–Type Low–Loss Filters" Y. Sato, O. Ikata, T. Matsuda, and T. Miyashita 1992 International Symposium on SAW Devices for Mobile Communications, Proceedings pp. 179–185.

*Primary Examiner*—Benny Lee
*Assistant Examiner*—Darius Gambino
*Attorney, Agent, or Firm*—Daniel C. Crilly; James A. Coffing

[57] ABSTRACT

A filter (200) having an input terminal (208), an output terminal (209), and a common terminal (210) includes two impedance inverters (201,202) and a first resonator (203) that is operable at a resonant frequency. Each impedance inverter (201, 202) is coupled to the common terminal (210) at a common node (223) and includes a corresponding input node (221,225) and output node (222, 226). The input node (221) of the first impedance inverter (201) is coupled to the input terminal (208). The input node (225) of the second impedance inverter (202) is coupled to the output node (222) of the first impedance inverter (201), while the output node (226) of the second impedance inverter (202) is coupled (e.g., via a second resonator (205)) to the output terminal (209). The first resonator (203) is coupled between the input terminal (208) and the output terminal (209).

18 Claims, 1 Drawing Sheet

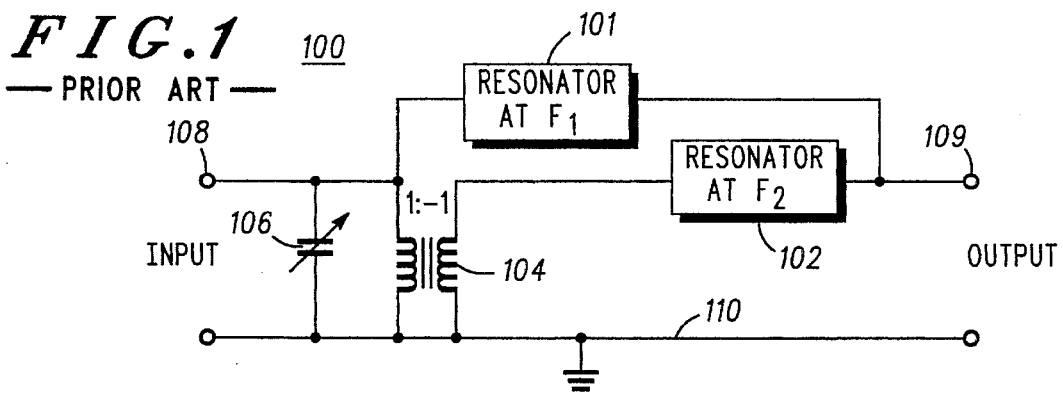
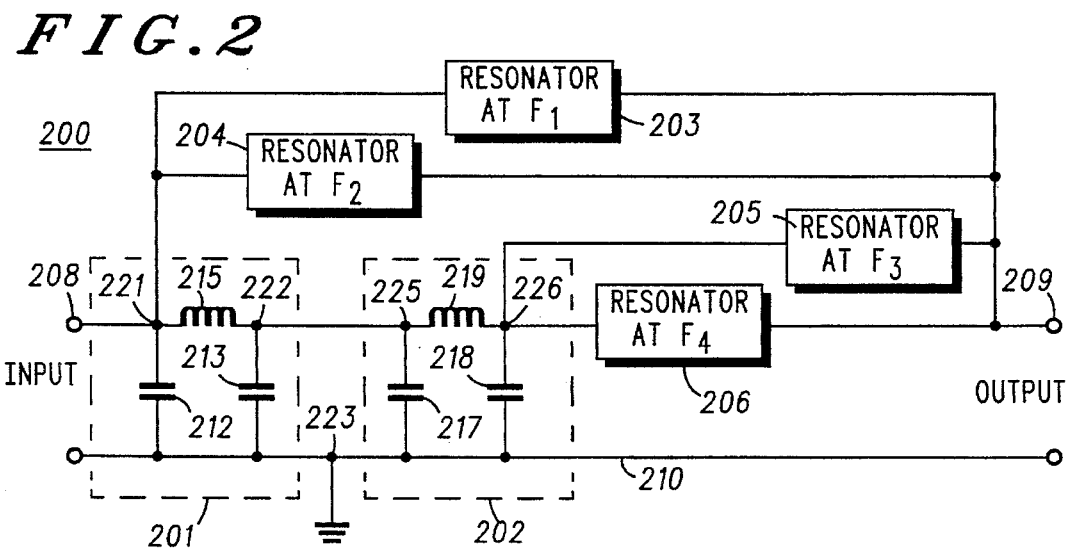
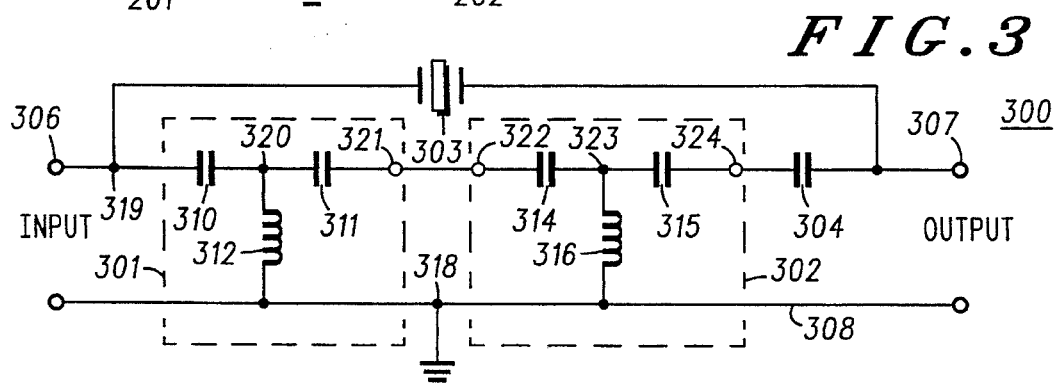
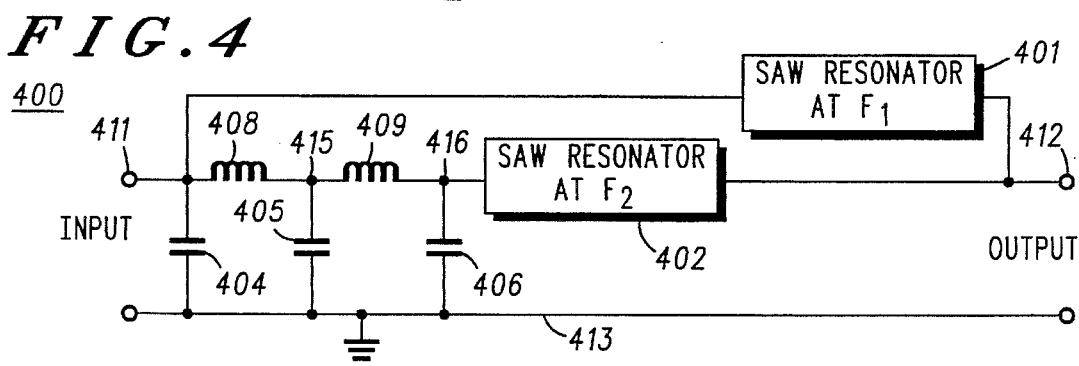

RESONATOR FILTER UTILIZING CASCADED IMPEDANCE INVERTERS

FIELD OF THE INVENTION

The present invention relates generally to high quality factor (Q), passive electronic filters and, in particular, to a one-half lattice resonator filter.

BACKGROUND OF THE INVENTION

High Q, passive electronic filters are known in the art. One such filter is the one-half lattice resonator filter. A typical one-half lattice filter is illustrated in FIG. 1. The typical filter 100 comprises two resonators 101, 102, a transformer 104, and a compensation capacitor 106. The compensation capacitor 106 and a primary winding of the transformer 104 are connected in parallel between an input terminal 108 and a common terminal 110 of the filter 100. One resonator 101 is connected between the input terminal 108 and an output terminal 109, while the other resonator 102 is connected in series with a secondary winding of the transformer 104 between the output terminal 109 and the common terminal 110. In a typical configuration, each resonator 101, 102 comprises a quartz crystal having a corresponding resonant frequency (e.g., $F_1$) and the transformer 104 comprises wires wrapped around a magnetic core, such as a toroid. The compensation capacitor 106 is typically a discrete capacitor selected to resonate with the inductance of the transformer's primary winding.

In a common application, the filter 100 is used as a bandpass filter centered at an intermediate frequency of a radio receiver. To provide a bandpass response, the resonant frequencies of the crystals 101, 102 reside in the passband of the filter 100 and are typically selected such that $F_1 > F_2$. When an input signal is applied to the input terminal 108, the filter 100 passes frequency components of the input signal that reside in the filter's passband and attenuates frequency components that reside in the stopband (i.e., outside the passband). The attenuation of the unwanted frequency components is provided by a 180 degree phase shift introduced by the transformer 104 (as denoted in the FIG. by the 1:-1 notation above the transformer 104). The phase shift provides essentially equal, but opposite, voltages of stopband frequency components in the branches that include the resonators 101, 102. Thus, when these voltages are combined at the output terminal 109, the net result is effectively zero transmission in the stopband. As is known, the actual filter rolloff (i.e., the slope of the attenuation outside the passband) is determined by filter topology (e.g., Butterworth, Chebyschev, etc.) and the number of crystals that constitute the resonators 101, 102.

By using a crystal filter as discussed above, high Q bandpass filters having center frequencies up to about 100 MHz are readily realizable. However, at frequencies above 100 MHz, the parasitic capacitances of the transformer 104 prevent the transformer 104 from providing the desired 180 degree phase shift, thereby degrading the attenuation capability of the filter. In addition, the inherently large size of the transformer 104 prohibits it from being constructed within a monolithic microwave integrated circuit (MMIC). MMICs are commonly used in current microwave and sub-microwave radio receivers to reduce receiver size and improve reliability.

Therefore, a need exists for a high Q filter that is readily realized at frequencies above 100 MHz and that is compatible with integrated circuit technologies.

BRIEF DESCRIPTION OF THE DRAWINGS

FIG. 1 illustrates a typical prior art one-half lattice filter.

FIG. 2 illustrates a combined schematic and block diagram depiction of a filter in accordance with a first embodiment of the present invention.

FIG. 3 illustrates a schematic depiction of a filter in accordance with an alternate embodiment of the present invention.

FIG. 4 illustrates a schematic and block diagram depiction of a filter in accordance with a preferred embodiment of the present invention.

DESCRIPTION OF A PREFERRED EMBODIMENT

Generally, the present invention encompasses a filter having an input terminal, an output terminal, and a common terminal. The filter comprises two impedance inverters and a first resonator that is operable at a resonant frequency. Each impedance inverter is coupled to the common terminal at a common node and includes a corresponding input node and output node. The input node of the first impedance inverter is coupled to the input terminal. The input node of the second impedance inverter is coupled to the output node of the first impedance inverter, while the output node of the second impedance inverter is coupled (e.g., via a second resonator) to the output terminal. The first resonator is coupled between the input terminal and the output terminal. By constructing the filter in this manner, the present invention overcomes the inherent high frequency limitations of prior art one-half lattice filters by obviating the need for a low frequency transformer.

The present invention can be more fully described with reference to FIGS. 2–4. FIG. 2 illustrates a combined schematic and block diagram depiction of a filter 200 having an input terminal 208, an output terminal 209, and a common terminal 210, in accordance with a first embodiment of the present invention. The filter 200 comprises two impedance inverters 201, 202 and four resonators 203–206. Each resonator 203–206 has a corresponding resonant frequency (e.g., $F_1$) and might comprise a quartz crystal, a surface acoustic wave (SAW) resonator, or any other type of high Q resonator. In this particular embodiment, each impedance inverter 201, 202 comprises a so-called pi network. That is, the first impedance inverter 201 includes two shunt capacitive elements 212, 213 and one series inductive element 215. Similarly, the second impedance inverter 202 includes two shunt capacitive elements 217, 218 and one series inductive element 219.

Each capacitive element 212, 213, 217, 218 comprises a discrete capacitor or a distributed capacitance. For example, if the filter 200 is incorporated into a monolithic microwave integrated circuit (MMIC), each capacitive element 212, 213, 217, 218 might comprise either a planar capacitor or a single electrode having a capacitance through a substrate of the MMIC to a grounded backplane. In an analogous manner, each inductive element 215, 219 comprises a discrete inductor or a distributed inductance. Thus, in the MMIC example, each inductive element 215, 219 might comprise either a planar spiral inductor or one or more wire bonds.

The first impedance inverter 201 is coupled to the common terminal 210 (i.e., ground) at a common node 223 and includes an input node 221 and an output node 222. As shown, the input node 222 is connected to the input terminal 208. As is also shown, the capacitive element 212 is connected between the input node 221 and the common node 223, while the capacitive element 213 is coupled between the output node 222 and the common node 223. The inductive element 215 is coupled between the input node 221 and the output node 222 to complete the construction of the first impedance inverter 201.

The second impedance inverter 202 is also coupled to the common terminal 210 at the common node 223 and includes an input node 225 and an output node 226. As shown, the second impedance inverter's input node 222 is connected to the first impedance inverter's output node 222. Similar to the topology of the first impedance inverter 201, the capacitive element 217 is connected between the second impedance inverter's input node 225 and the common node 223, while the capacitive element 218 is coupled between the second impedance inverter's output node 226 and the common node 223. The inductive element 219 is coupled between the second impedance inverter's input node 225 and output node 226 to complete the construction of the second impedance inverter 202. It is well understood in the art that the two parallel capacitive elements 213, 217 can be combined to form a single capacitive element. This reduced element configuration is detailed below with regard to FIG. 4.

In the particular embodiment illustrated in FIG. 2, two resonators 203, 204 are connected in parallel between the input terminal 208 and the output terminal 209. In addition, two resonators 205, 206 are connected in parallel between the second impedance inverter's output node 226 and the output terminal 209. As mentioned above, each resonator 203–206 operates at a corresponding resonant frequency.

Operation of this embodiment of the present invention occurs in the following manner. An input signal—e.g., a wideband, multiple frequency signal from an output of a radio frequency (RF) signal down-converter—is applied to the input terminal 208. Frequency components of the input signal residing in a passband of the filter 200 are transmitted through the filter 200, while frequency components of the input signal residing outside the passband are attenuated. The passband of the filter 200 is determined by the series resonant frequencies ($F_1$–$F_4$) of the resonators 203–206. In a preferred embodiment, the resonant frequencies lie within the desired passband and are uniformly separated across the passband. The resonant frequencies of the resonators 203, 204 are preferably interposed with the resonant frequencies of the resonators 205, 206. For example, a combination of resonant frequencies such as $F_1<F_3<F_2<F_4$ produces a nominal passband from $F_1$ to $F_4$. Thus, this embodiment of the filter 200 attenuates particular frequency components of the input signal in accordance with a bandpass frequency response.

The attenuation of frequency components outside the passband of the filter 200 (i.e., in the stopband) is provided by a 180 degree phase shift produced by the two cascaded impedance inverters 201, 202. This phase shift provides substantially equal, but opposite, voltages of stopband frequency components in the branches that include the resonators 203–206. When these voltages are combined at the output terminal 209, the net result is effectively zero transmission in the stopband. In traditional low frequency filters, this phase shift is accomplished by the use of a transformer as described above with regard to FIG. 1. It should be noted that the filter 200 also provides an attenuation maximum due to the frequency sensitive phase shift of the impedance inverters 201, 202. The frequency at which this maximum occurs can be adjusted by changing the values of the components 212, 213, 215, 217, 218, 219 in the impedance inverters 201, 202. It should be further noted that more, or fewer, resonators might be incorporated in the filter 200, depending on the desired frequency response.

The present invention enables one-half lattice filter structures to be used at much higher frequencies by eliminating the low frequency transformer, a critical element that undesirably limits the high frequency response of prior art filters. The present invention replaces the transformer With elements that are more readily constructed at very high frequencies (e.g., above 100 MHz) and that are readily adjusted in response to desired changes in the filter's frequency response. In addition, the present invention is well suited for MMIC applications, especially when the impedance inverters 201, 202 include a larger number of capacitive elements than inductive elements.

FIG. 3 illustrates a schematic depiction of a filter 300 having an input terminal 306, an output terminal 307, and a common terminal 308, in accordance with an alternate embodiment of the present invention. The filter 300 comprises two impedance inverters 301, 302, a quartz crystal 303 having a corresponding resonant frequency, and a compensation capacitor 304. In this particular embodiment, each impedance inverter 301, 302 comprises a so-called T-network. That is, the first impedance inverter 301 includes two series capacitive elements 310, 311 and one shunt inductive element 312. Similarly, the second impedance inverter 302 includes two series capacitive elements 314, 315 and one shunt inductive element 316. Each capacitive element 304, 310, 311, 314, 315 might comprise a discrete capacitor or a distributed capacitance, while each inductive element 312, 316 might comprise a discrete inductor or a distributed inductance, as described above with reference to the comparable elements of FIG. 2.

The first impedance inverter 301 is coupled to the common terminal 308 (i.e., ground) at a common node 318 and includes an input node 319, a central node 320, and an output node 321. As shown, the input node 319 is connected to the input terminal 306. As is also shown, the capacitive element 310 is connected between the input node 319 and the central node 320, while the inductive element 312 is coupled between the central node 320 and the common node 318. The capacitive element 311 is coupled between the central node 320 and the output node 321 to complete the construction of the first impedance inverter 301.

The second impedance inverter 302 is also coupled to the common terminal 308 at the common node 318 and includes an input node 322, a central node 323, and an output node 324. As shown, the second impedance inverter's input node 322 is connected to the first impedance inverter's output node 321. Similar to the topology of the first impedance inverter 301, the capacitive element 314 is connected between the second impedance inverter's input node 322 and the central node 323, while the inductive element 316 is coupled between the central node 323 and the common node 318. The capacitive element 315 is coupled between the central node 323 and the output node 324 to complete the construction of the second impedance inverter 302. It should be noted that the two series capacitive elements 311, 314 can be combined to form a single capacitive element, as is well known in the art.

Operation of this embodiment of the present invention occurs in a manner analogous to the operation of the filter 200 depicted in FIG. 2. When an input signal is applied to the input terminal 306, the filter 300 passes frequency components of the input signal that reside in the passband to the output terminal 307, while attenuating frequency components that reside in the stopband. In this configuration, the filter's passband is determined by the resonant frequency of the quartz crystal 303 and the loading effects of the external circuitry connected to the filter 300 at the input and output terminals 306, 307. The crystal 303 effectively provides a series resonant circuit between the input terminal 306 and the output terminal 307 since the inherent shunt capacitance of the crystal 303 is essentially equalized by the capacitor 304. Therefore, since the series resonant frequency ($F_O$) of the crystal 303 is located in the filter passband, the loaded Q of the crystal 303, which defines the passband bandwidth (BW) of the filter, is impacted by the impedance of the crystal 303 and the loading provided by the external circuitry connected at the filter's input and output terminals 306, 307 (i.e., loaded $Q=F_O/BW$). Similar to the discussion with regard to the filter 200, the attenuation in the stopband of the filter 300 is provided by the 180 degree phase shift produced by the two cascaded impedance inverters 301, 302.

FIG. 4 illustrates a schematic and block diagram depiction of a filter 400 having an input terminal 411, an output terminal 412, and a common terminal 413, in accordance with a preferred embodiment of the present invention. The filter 400 comprises two SAW resonators 401, 402, three shunt capacitors 404–406, and two series inductors 408–409. Each SAW resonator 401, 402 has a corresponding resonant frequency (e.g., $F_1$), as denoted in FIG. 4. As also shown, the capacitor 404 is connected between the input terminal 411 and the common terminal 413, while the inductor 408 is connected between the input terminal 411 and a central node 415. In a similar manner, the capacitor 405 is connected between the central node 415 and the common terminal 413, while the inductor 409 is connected between the central node 415 and a central node 416. The capacitor 406 is connected between the central node 416 and the common terminal 413. One SAW resonator 410 is connected between the input terminal 411 and the output terminal 412, while the other SAW resonator 402 is connected between the central node 416 and the output terminal 412. The filter 400 illustrates the case in which two capacitors, one from each of two impedance inverters, have been combined in parallel to form the single capacitor 405.

Operation of the preferred filter 400 is similar to the operation of the filter 200 described above with regard to FIG. 2. However, this embodiment provides a slower stopband rolloff due to the presence of only two resonators 401, 402 as compared with the four resonators present in the filter 200 of FIG. 2. It should be noted that in an alternate embodiment two or more filters 400 might be cascaded to effectively increase the stopband rolloff, depending on circuit size constraints.

In a preferred embodiment, the filter 400 provides a bandpass filter response having a bandwidth of 28 MHz centered at a frequency of 836 MHz. This response is accomplished by utilizing a first SAW resonator 401 having a resonant frequency of 819 MHz and a second SAW resonator 402 having a resonant frequency of 839 MHz. Each SAW resonator 401, 402 has a motional inductance of approximately 500 nanohenries (nil) and a shunt capacitance of approximately 1.9 picofarads (pF). SAW resonators 401, 402 are preferred for this particular filter 400 because they are high frequency planar devices that have high Qs and are readily fabricated within a MMIC. The remaining elements 404–406, 408, 409 are preferably distributed reactances with the following values:

capacitor 404=3.6 pF, capacitor 405=7.6 pF, capacitor 406=3.8 pF, inductor 408=9.5 nil, and inductor 409=9.5 nil. The preferred filter 400 is intended to operate into 50 ohm input and output terminating impedances.

The present invention encompasses a filter having an input terminal, an output terminal, and a common terminal. With this invention, a one-half lattice filter structure may be used at much higher frequencies than one-half lattice filters of the prior art. In addition, the present invention is well suited for MMIC applications, especially when the filter includes a larger number of capacitors than inductors. Further, the present invention includes components that are readily adjusted in response to desired changes in the filter's frequency response.

What is claimed is:

1. A filter having an input terminal, an output terminal, and a common terminal, comprising:

a first impedance inverter that is coupled to the common terminal at a common node, wherein the first impedance inverter includes a first input node and a first output node, wherein the first input node is coupled to the input terminal, and wherein the first impedance inverter provides a first 90 degree phase shift between the first input node and the first output node at a center frequency of the filter;

a second impedance inverter that is coupled to the common terminal at the common node, wherein the second impedance inverter includes a second input node and a second output node, wherein the second input node is coupled to the first output node-and wherein the second impedance inverter provides a second 90 degree phase shift between the second input node and the second output node at the center frequency of the filter, such that the first impedance inverter and the second impedance inverter cascaded together provide 180 degrees of phase shift at the center frequency of the filter; and a first resonator, operably coupled between the input terminal and the output terminal, having a first resonant frequency.

2. The filter of claim 1, further comprising a second resonator, operably coupled between the second output node and the output terminal, having a second resonant frequency.

3. The filter of claim 2, wherein the second resonator comprises a surface acoustic wave resonator.

4. The filter of claim 2, wherein the second resonator comprises a quartz crystal.

5. The filter of claim 2, further comprising at least a third resonator, operably coupled between the second output node and the output terminal, having a third resonant frequency.

6. The filter of claim 1, further comprising a capacitive element that is operably coupled between the second output node and the output terminal.

7. The filter of claim 1, wherein the first impedance inverter comprises a pi network.

8. The filter of claim 7, wherein the pi network comprises:

a first capacitive element coupled between the first input node and the common node;

an inductive element coupled between the first input node and the first output node; and a second capacitive element coupled between the first output node and the common node.

9. The filter of claim 1, wherein the first impedance inverter comprises a T-network.

10. The filter of claim 9, wherein the T-network comprises:

a first capacitive element coupled between the first input node and a central node;

an inductive element coupled between the central node and the common node; and a second capacitive element coupled between the central node and the first output node.

11. The filter of claim 1, wherein the second impedance inverter comprises a pi network.

12. The filter of claim 11, wherein the pi network comprises:

a first capacitive element coupled between the second input node and the common node;

an inductive element coupled between the second input node and the second output node; and a second capacitive element coupled between the second output node and the common node.

13. The filter of claim 1, wherein the second impedance inverter comprises a T-network.

14. The filter of claim 1, further comprising at least a second resonator, operably coupled between the input terminal and the output terminal, having a second resonant frequency.

15. The filter of claim 1, wherein the first resonator comprises a surface acoustic wave resonator.

16. The filter of claim 1, wherein the first resonator comprises a quartz crystal.

17. A filter having an input terminal, an output terminal, and a common terminal, comprising:

a first capacitive element coupled between the input terminal and a first node;

a first inductive element coupled between the first node and the common terminal;

a second capacitive element coupled between the first node and a second node;

a second inductive element coupled between the second node and the common terminal;

a third capacitive element coupled between the second node and a third node, wherein the first capacitive element, the first inductive element, the second capacitive element, the second inductive element, and the third capacitive element together provide 180 degrees of phase shift at a center frequency of the filter;

a first quartz crystal, operably coupled between the input terminal and the output terminal, having a first resonant frequency; and a second quartz crystal, operably coupled, between the third node and the output terminal, having a second resonant frequency.

18. A filter having an input terminal, an output terminal, and a common terminal, comprising:

a first capacitor connected between the input terminal and the common terminal;

a first inductor connected between the input terminal and a first node;

a second capacitor connected between the first node and the common terminal;

a second inductor connected between the first node and a second node;

a third capacitor connected between the second node and the common terminal wherein the first capacitor, the first inductor, the second capacitor, the second inductor, and the third capacitor together provide 180 degrees of phase shift at a center frequency of the filter;

a first surface acoustic wave resonator, connected between the input terminal and the output terminal, having a first resonant frequency; and a second acoustic wave resonator, connected between the second node and the output terminal, having a second resonant frequency.

\* \* \* \* \*